(12) United States Patent
Fukuzawa et al.

(10) Patent No.: US 7,602,592 B2
(45) Date of Patent: Oct. 13, 2009

(54) MAGNETORESISTIVE ELEMENT INCLUDING CONNECTION LAYERS WITH MAGNETIZATION ALIGNMENT ANGLES THEREBETWEEN OF 30 TO 60° BETWEEN METALLIC MAGNETIC LAYERS

(75) Inventors: Hideaki Fukuzawa, Kawasaki (JP); Hiromi Yuasa, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 557 days.

(21) Appl. No.: 11/441,351

(22) Filed: May 26, 2006

(65) Prior Publication Data
US 2006/0268470 A1    Nov. 30, 2006

(30) Foreign Application Priority Data
May 26, 2005    (JP)    ............................. 2005-154023

(51) Int. Cl.
G11B 5/39    (2006.01)
(52) U.S. Cl. ............................. 360/324.12; 360/324.2
(58) Field of Classification Search .... 360/324.1–324.2
See application file for complete search history.

(56) References Cited

U.S. PATENT DOCUMENTS

| | | | |
|---|---|---|---|
| 4,258,126 A | 3/1981 | Hiesinger | |
| 5,701,223 A | 12/1997 | Fontana, Jr. et al. | |
| 6,262,869 B1 | 7/2001 | Lin et al. | |
| 6,348,274 B1 | 2/2002 | Kamiguchi et al. | |
| 6,519,123 B1 | 2/2003 | Sugawara et al. | |
| 6,667,616 B1 | 12/2003 | Shukh et al. | |
| 6,687,099 B2 | 2/2004 | Nakatani et al. | |
| 6,710,984 B1 | 3/2004 | Yuasa et al. | |
| 6,807,034 B2 | 10/2004 | Hasegawa et al. | |
| 6,956,765 B2 | 10/2005 | Saito et al. | |
| 6,967,386 B2 | 11/2005 | Mizuguchi | |
| 7,054,119 B2 | 5/2006 | Sharma et al. | |
| 7,196,877 B2 | 3/2007 | Yoshikawa et al. | |
| 7,307,819 B2 | 12/2007 | Fukuzawa et al. | |
| 2002/0191348 A1* | 12/2002 | Hasegawa et al. ........... 360/314 |
| 2003/0063415 A1 | 4/2003 | Hasegawa et al. | |
| 2003/0104249 A1 | 6/2003 | Okuno et al. | |
| 2003/0184919 A1 | 10/2003 | Lin et al. | |

(Continued)

FOREIGN PATENT DOCUMENTS

CN    1153371    7/1997

(Continued)

OTHER PUBLICATIONS

Office Action dated Jul. 27, 2007 in China Application 2006100924062 and English-language translation.

*Primary Examiner*—A. J. Heinz
(74) *Attorney, Agent, or Firm*—Nixon & Vanderhye PC

(57) ABSTRACT

A magnetoresistive element includes at least three metallic magnetic layers, connection layers each provided between the metallic magnetic layers, and electrodes which supply a current perpendicularly to a plane of a stack of the metallic magnetic layers and the connection layers. A magnetization direction of a lowermost or uppermost metallic magnetic layer of the metallic magnetic layers is pinned, and a magnetization direction of an intermediate metallic magnetic layer is twisted such that magnetization directions of the lowermost and the uppermost metallic magnetic layers are made substantially orthogonal to each other at zero external field.

11 Claims, 6 Drawing Sheets

U.S. PATENT DOCUMENTS

2004/0100855 A1 5/2004 Saito et al.
2005/0280957 A1* 12/2005 Gill ........................ 360/324.12

FOREIGN PATENT DOCUMENTS

| CN | 1503229 | 6/2004 |
| CN | 1534605 | 10/2004 |
| JP | 2000-099922 | 4/2000 |
| JP | 2003-204095 | 7/2003 |

* cited by examiner

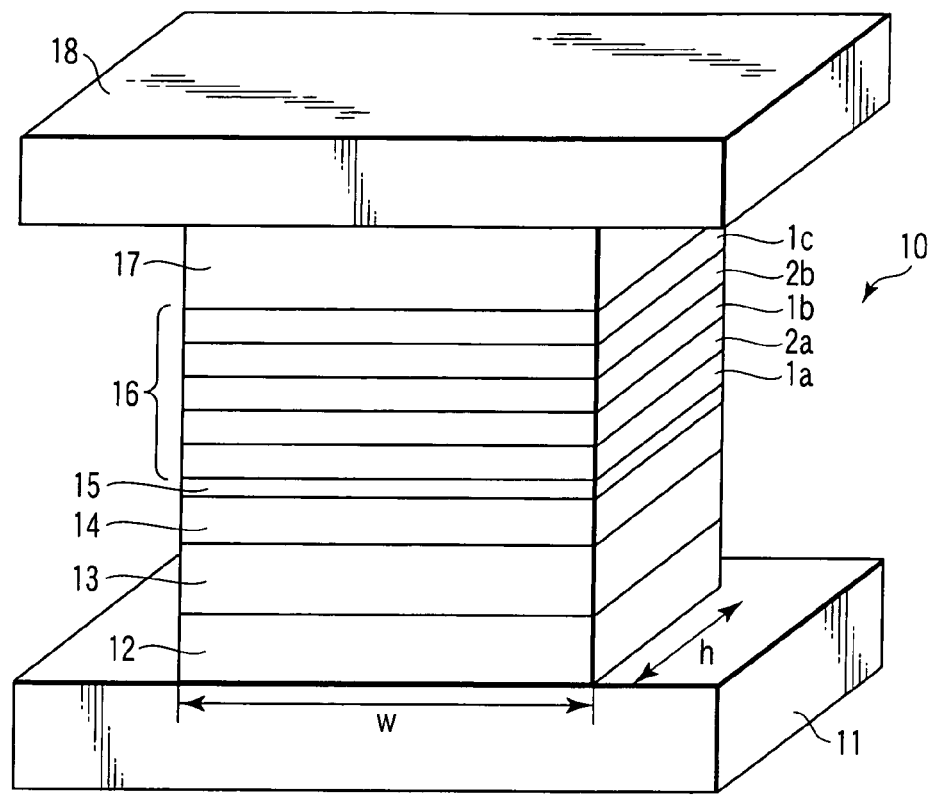
F I G. 1
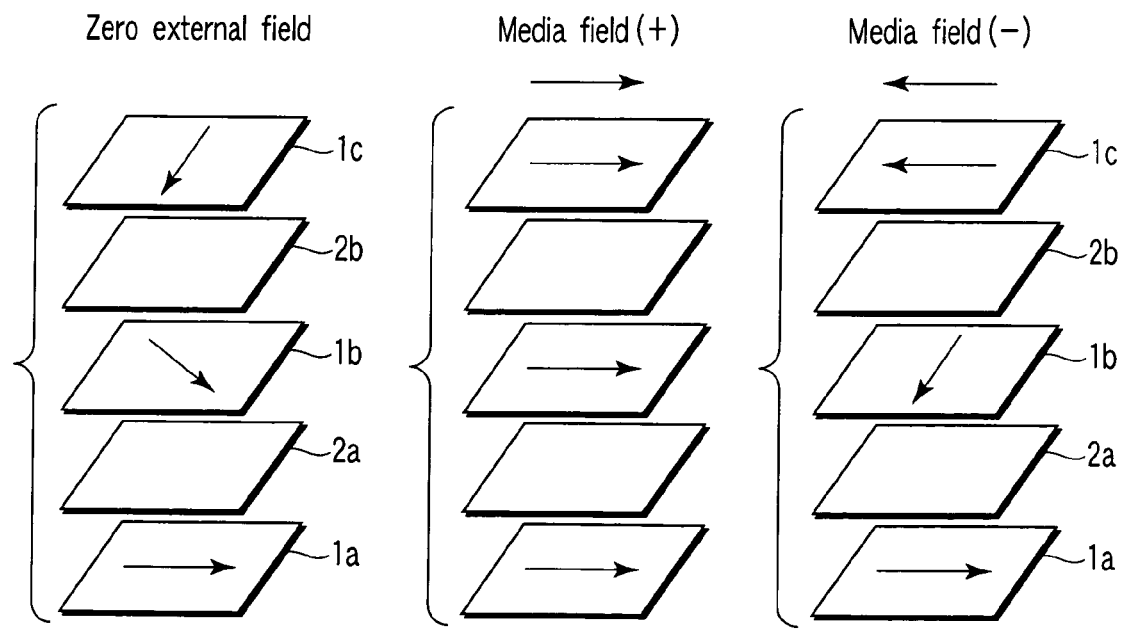
F I G. 2A  F I G. 2B  F I G. 2C

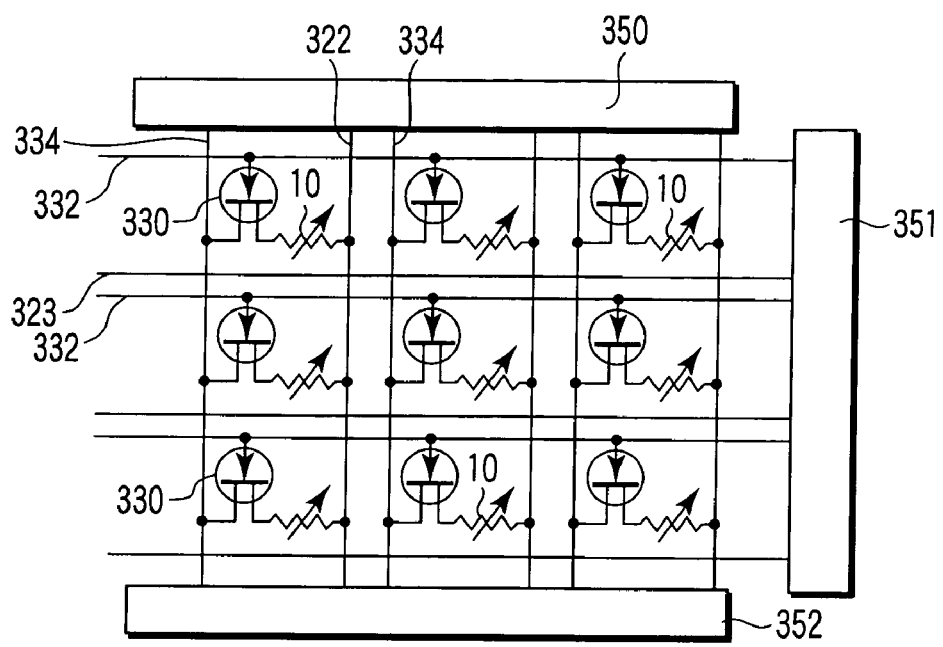
F I G. 8
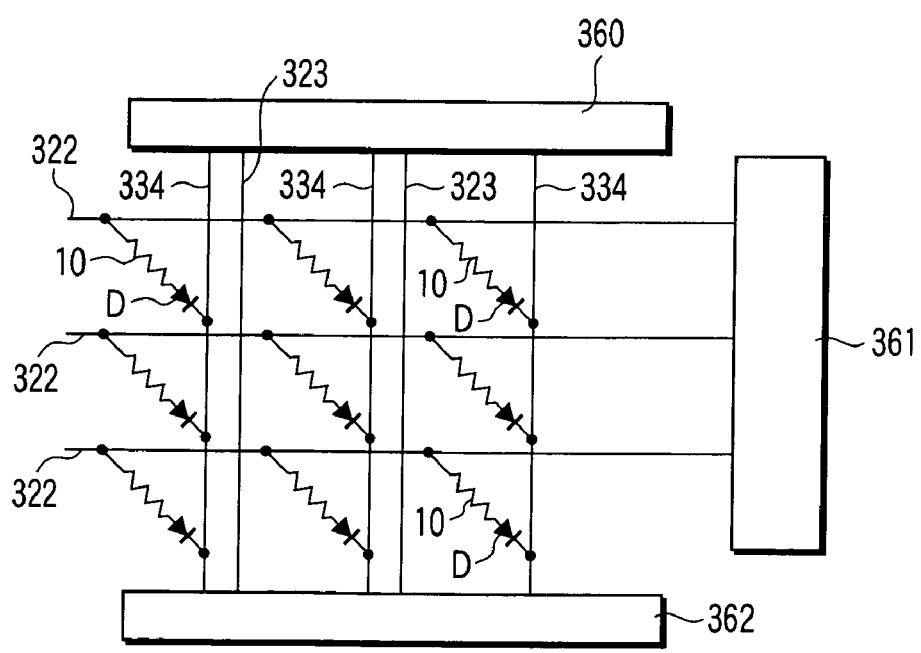
F I G. 9

MAGNETORESISTIVE ELEMENT INCLUDING CONNECTION LAYERS WITH MAGNETIZATION ALIGNMENT ANGLES THEREBETWEEN OF 30 TO 60° BETWEEN METALLIC MAGNETIC LAYERS

CROSS-REFERENCE TO RELATED APPLICATIONS

This application is based upon and claims the benefit of priority from prior Japanese Patent Application No. 2005-154023, filed May 26, 2005, the entire contents of which are incorporated herein by reference.

BACKGROUND OF THE INVENTION

1. Field of the Invention

The present invention relates to a magnetoresistive element having a structure in which a current is supplied perpendicularly to the plane of the element, and a magnetic head, a magnetic recording/reproducing apparatus and a magnetic memory which use the magnetoresistive element.

2. Description of the Related Art

The performance of magnetic devices has drastically been improved by discovery of a giant magnetoresistive effect (GMR) in a stacked structure of magnetic films. In particular, a spin-valve film (SV film) has a structure easily applicable to a magnetic device and enables to effectively produce GMR effect. Consequently, the spin-valve film has brought about marked technical improvement to magnetic heads and magnetic devices such as MRAMs (magnetic random access memories).

The "spin-valve film" is a stacked film having a structure in which a nonmagnetic metal spacer layer is sandwiched between two ferromagnetic layers. In the spin-valve film, the magnetization of one ferromagnetic layer (referred to as a "pinned layer" or "magnetization pinned layer") is pinned by an antiferromagnetic layer or the like, whereas the magnetization of the other ferromagnetic layer (referred to as a "free layer" or "magnetization free layer") can be rotated according to an external field (for example, a media field). In the spin-valve film, a giant magnetoresistace change can be produced by varying a relative angle between the magnetization directions of the pinned layer and free layer.

Conventional spin-valve films are CIP (current-in-plane)-GMR elements in which a sense current is supplied parallel to the plane of the element. In recent years, much attention has been paid to CPP (current-perpendicular-to-plane)-GMR elements (referred to as "CPP elements" hereinafter) in which a sense current is supplied substantially perpendicular to the plane of the element.

When such a magnetoresistive element is applied to a magnetic head, a higher element resistance poses problems in regard to shot noise and high frequency response. In connection with these problems, the CPP element has an advantage that the element resistance depends on its area so that reduction in the size of the element increases the resistance change. The CPP element is thus advantageously applicable to magnetic devices on a trend of increasingly reducing the size thereof. Under the circumstances, the CPP element and the magnetic head using the same are expected to be promising candidates to achieve a recording density of 200 Gbpsi to 1 Tbpsi (terabits per square inch). However, CPP elements using a spacer layer made of a nonmagnetic metal exhibit only a very small resistance change. The CPP elements are thus hard to provide high output signals.

To partly solve this problem, an improved type of CPP (current-confined-path) element has been proposed which uses a spacer layer comprising an insulating layer in which fine current paths (current confined paths) formed of a nonmagnetic metal penetrating the insulating layer are formed. Such a CPP element (referred to as a CCP-CPP element hereinafter) exhibits a current confining effect and provides higher output signals than a simple CPP element using a nonmagnetic metal spacer layer. However, if the CCP-CPP element is applied to a magnetic head adapted for high density recording, the MR ratio thereof might still be insufficient.

Thus, a magnetoresistive element operating under a novel mechanism is greatly desired which realizes a very high MR ratio corresponding to a higher recording density.

BRIEF SUMMARY OF THE INVENTION

A magnetoresistive element according to an aspect of the present invention comprises: at least three metallic magnetic layers; connection layers each provided between the metallic magnetic layers; and electrodes which supply a current perpendicularly to a plane of a stack of the metallic magnetic layers and the connection layers, wherein a magnetization direction of a lowermost or uppermost metallic magnetic layer of the metallic magnetic layers is pinned, and a magnetization direction of an intermediate metallic magnetic layer is twisted such that magnetization directions of the lowermost and the uppermost metallic magnetic layers are made substantially orthogonal to each other at zero external field.

BRIEF DESCRIPTION OF THE SEVERAL VIEWS OF THE DRAWING

FIG. 1 is a perspective view of a magnetoresistive element according to an embodiment of the present invention;

FIGS. 2A, 2B, and 2C are diagrams illustrating the magnetization directions of the metallic magnetic layers in the case where no external field is applied and in the cases where a media field (+) and a media field (−) are applied, respectively, to the magnetoresistive element according to an embodiment of the present invention;

FIG. 8 is a diagram showing an example of a matrix configuration in a magnetic memory according to an embodiment of the present invention;

FIG. 9 is a diagram showing another example of a matrix configuration in a magnetic memory according to an embodiment of the present invention;

DETAILED DESCRIPTION OF THE INVENTION

Figures 3A, 3B, 3C:
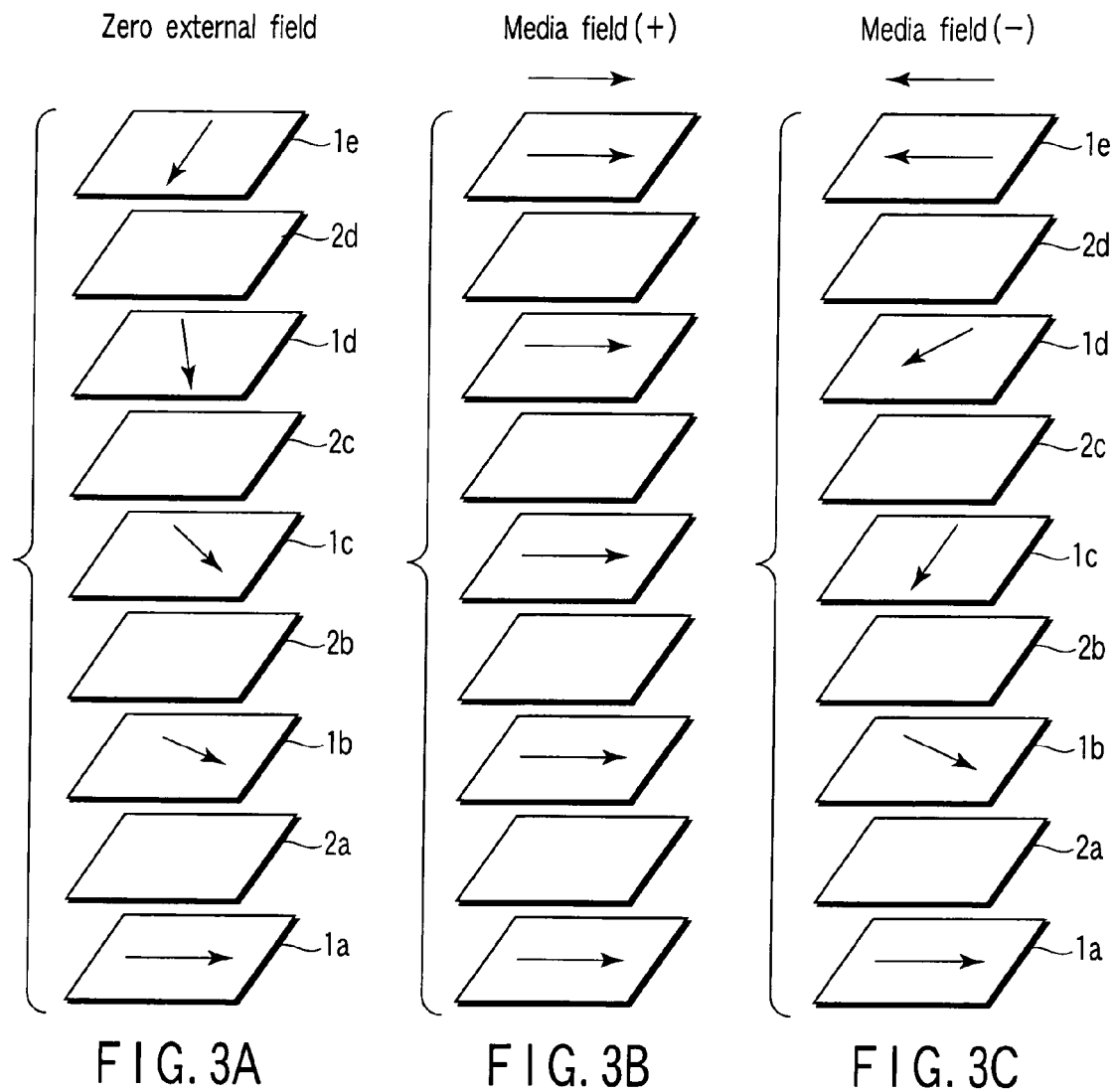
FIGS. 3A, 3B, and 3C are diagrams illustrating the magnetization directions of the metallic magnetic layers in the case where no external field is applied and in the cases where a media field (+) and a media field (−) are applied, respectively, to the magnetoresistive element according to another embodiment of the present invention.

FIG. 1 shows a perspective view of a magnetoresistive element according to an embodiment of the present invention. FIGS. 2A, 2B and 2C schematically show a region, which may be referred to as a spring spin-valve film hereinafter, in the element shown in FIG. 1 where a MR change is produced.

The magnetoresistive element has a structure that a lower electrode 11, a buffer layer 12, an antiferromagnetic layer 13, a ferromagnetic layer 14, a Ru layer 15, a spring spin-valve film 16 (a metallic magnetic layer 1a, a connection layer 2a, a metallic magnetic layer 1b, a connection layer 2b, and a metallic magnetic layer 1c), a cap layer 17, and an upper electrode 18 are stacked.

In this figure, the spring spin-valve film 16 has a structure that the metallic magnetic layer 1a, connection layer 2a, metallic magnetic layer 1b, connection layer 2b, and metallic magnetic layer 1c, which are stacked. The connection layers 2a and 2b are formed of a magnetic oxide or a metallic antiferromagnetic material. The two adjacent metallic magnetic layers included in the spring spin-valve film 16 are magnetically weakly coupled together through the connection layer sandwiched therebetween. In FIG. 1, the stack of the antiferromagnetic layer 13, ferromagnetic layer 14 and Ru layer 15 functions as a pinning layer (what is called a synthetic pinning layer) to pin the magnetization in the lowermost metallic magnetic layer 1a in the spring spin-valve film 16. In the magnetoresistive element in FIG. 1, a current is passed through the stacked film between the lower electrode 11 and upper electrode 18 perpendicularly to the plane of the stacked film.

With reference to FIGS. 2A, 2B and 2C, there will be described the magnetization directions of the metallic magnetic layers 1a-1c in the case where no external field (media field) is applied and in the cases where a media field (+) and a media field (−) are applied, respectively.

The lowermost metallic magnetic layer 1a has a magnetization whose direction is pinned so as to function as a pinned layer. The uppermost metallic magnetic layer 1c has a magnetization whose direction is varied depending on an external field so as to function as a free layer. The functions of the metallic magnetic layer 1b and connection layers 2a and 2b, located between the lowermost and uppermost metallic magnetic layers 1a and 1c, cannot be simply classified into those of the pinned layer, spacer layer and free layer as in the case of a common spin-valve film. In a sense, the connection layer and metallic magnetic layer stacked in proximity to the free layer function as a part of the free layer, while the connection layer and metallic magnetic layer stacked in proximity to the pinned layer function as a part of the pinned layer. In another sense, those layers other than the metallic magnetic layers 1a and 1c functioning as the pinned and free layers, respectively, can be considered as magnetic spacer layers, because these layers have magnetization directions slightly different from those of the pinned and free layers. Accordingly, in contrast to the prior art, it is difficult to clearly define the pinned layer, spacer layer and free layer in the magnetoresistive element according to the present invention. Thus, in the present specification, a single metallic magnetic layer having a magnetization whose direction is not substantially varied even under external field application is called a pinned layer (magnetization pinned layer; only 1a in FIG. 2A), while a metallic magnetic layer having a magnetization whose direction is most significantly varied by external field application is called a free layer (magnetization free layer; only 1c in FIG. 2A).

As shown in FIG. 2A, at zero external field, the magnetization direction of the uppermost metallic magnetic layer 1c is almost orthogonal to that of the lowermost metallic magnetic layer 1a, and the magnetization direction of the metallic magnetic layer 1b, located between the lowermost metallic magnetic layer 1a and the uppermost metallic magnetic layer 1c, is twisted by certain degrees. The at least three metallic magnetic layers are thus weakly magnetically coupled together, with the magnetization directions of these metallic magnetic layers twisted by degrees with respect to one another like a spring. Thus, the magnetoresistive element according to the present invention is called a spring spin-valve film.

As shown in FIGS. 2B and 2C, when an external field is applied, the magnetization direction of the uppermost metallic magnetic layer 1c is varied depending on the direction of the external field, and the magnetization direction of the intermediate metallic magnetic layer 1b is correspondingly varied. Then, if a media field applied in a direction shown in FIG. 2B (denoted as (+) direction) makes the magnetization direction of the uppermost metallic magnetic layer 1c parallel to that of the lowermost metallic magnetic layer 1a, a sense current flows perpendicularly to the plane under a low resistance. However, some combinations of materials may produce a high resistance under this magnetization alignment. On the other hand, if a media field applied in the opposite direction (denoted as (−) direction) shown in FIG. 2C, the magnetization direction of the uppermost metallic magnetic layer 1c is anti-parallel to that of the lowermost metallic magnetic layer 1a. In this case, a sense current flows perpendicularly to the plane under a high resistance. However, some combinations of materials may produce a low resistance under this magnetization alignment.

On the basis of the above principle, the magnetoresistive element according to the present invention can achieve both practical operations of a spin-valve film and a high MR ratio.

Now, materials used for the magnetoresistive element according to the embodiment of the present invention will be described.

(i) The lower electrode is formed of Cu, Au, Cr, Ta or NiFe.

(ii) The underlayer is formed of any of the materials listed below.

A metal selected from the group consisting of Ti, Ta, W, Cr, Mo, Nb, V, Zr, and Hf or an alloy containing any of these metals [thickness: 3 nm or more and 10 nm or less];

Ta [3 to 5 nm]/Ru [2 nm];

NiFeCr [3 to 5 nm];

Ta [3 nm]/NiFeCr [3 to 5 nm]; and

Ta [3 nm]/NiFe [2 to 5 nm].

(iii) The pinning layer is formed of any of the materials listed below.

An antiferromagnetic layer made of IrMn, PtMn, or PdPtMn;

a hard layer made of CoPt, CoPrCr, or FePt;

an antiferromagnetic layer (such as IrMn, PtMn, and PdPtMn)/a ferromagnetic layer/Ru;

a hard layer (such as CoPt, CoPrCr, and FePt)/a ferromagnetic layer/Ru.

A pinning layer of a stacked structure such as PtMn/CoFe [3 nm]/Ru is referred to as a synthetic pinning layer because the metallic magnetic layers under and over the Ru layer are antiferromagnetically coupled through the Ru layer. The pinning layer may be a single pinning layer made of IrMn, PtMn, or PdPtMn or a hard layer. However, the synthetic pinning layer can substantially eliminate net magnetic moment of the pinned layer to prevent the adverse effect of a leakage field from the pinned layer. A material for the ferromagnetic layer contained in the synthetic pinning layer may be similar to that for a metallic magnetic layer in the spring spin-valve film described later. Accordingly, for the material for the ferromagnetic layer, read the corresponding description.

The thickness of the metallic magnetic layer formed below the Ru layer contained in the synthetic pinning layer is preferably at most half the total thickness of the metallic magnetic layer contained in the spring spin-valve film above the Ru layer. Further, the thickness of the metallic magnetic layer formed below the Ru layer is preferably 1 to 10 nm, and more preferably 1 to 5 nm.

(iv) The pinned layer is formed of any of the materials listed below and may be a single magnetic layer or a stacked film made of a magnetic layer and a nonmagnetic layer.

Fe, Co, Ni, Co—Fe, Ni—Fe, Ni—Fe, Ni—Co, Fe—Co—Ni, an alloy containing Co, an alloy containing Ni, or an alloy containing Fe;

(FeCo/Cu)×n cycles;
(CoNi/Cu)×n cycles;
(NiFe/Cu)×n cycles; and
(FeCoNi/Cu)×n cycles.

A stacked film of, for example, n-cycle (FeCo/Cu) preferably uses a Fe-rich magnetic layer with a Fe concentration of 50% or more. Such a metallic magnetic layer has an effect of enhancing bulk scattering. In enhancing the magnetic coupling between the upper and lower metallic magnetic layers, it is not preferable to make the thickness of a nonmagnetic layer such as Cu excessively thick. The thickness thereof is preferably 0.1 to 1 nm, and more preferably 0.1 to 0.5 nm. Alternatively, a Heuslar alloy such as CoMnGe, NiMnSb, CoMnAl, CoMnSi or CoMnSiAl may be used.

Further, additive elements may be added to these magnetic materials. The additive elements include Cu, Cr, Ti, V, Mn, Zr, Nb, Mo, Hf, Ta, W, and Pt. A FeCoCu alloy prepared by adding Cu to FeCo is particularly preferable because it enhances the bulk scattering effect. The concentration of the nonmagnetic additive element preferably ranges between 1 at % or more and 50 at % or less, more preferably between 2 at % or more and 20 at % or less. Further, these metallic magnetic materials may be nitrided.

The thickness $t_m$ of each metallic magnetic layer is preferably 0.5 to 10 nm and more preferably 0.5 to 5 nm. A plurality of metallic magnetic layers may be formed of the same material or different materials. However, since a metallic magnetic layer located away from the pinning layer must be able to easily cause magnetization rotation depending on a media field, it is preferably formed of a NiFe, CoFe, NiCo, Fe, NiFeCo, or CoFeNi alloy, or a soft magnetic material prepared by adding an additive element to any of these alloys. On the other hand, a material for a metallic magnetic layer close to the pinning layer need not be limited to the soft magnetic material. It is preferable to use a magnetic material that is advantageous for providing a high MR ratio.

At least three metallic magnetic layers allow the function of the spring spin-valve film. The number of the metallic magnetic layers is preferably 3 to 20, and more preferably 3 to 10. The total thickness of the metallic magnetic layers is preferably about 3 to 30 nm, and more preferably about 5 to 20 mm. The excessively large total thickness of the metallic magnetic layers increases the MR ratio but also provides an increased resistance. This is not preferable in terms of high frequency response. When the total thickness of the metallic magnetic layers is small, it is preferable in terms of processes for manufacturing a magnetic head or MRAM. However, the excessively small total thickness of the metallic magnetic layers may limit the selection of a material exhibiting a high MR ratio.

The crystal structure of the metallic magnetic layer preferably has an fcc (111) orientation for an fcc structure, a bcc (110) orientation for a bcc structure, and an hcp (001) or (110) orientation for an hcp structure.

The crystal orientation preferably has a dispersion angle of 4.0° or less, more preferably at most 3.5° or less, further preferably at most 3.0° or less. This value can be obtained by, for example, measuring the full width at half maximum of a rocking curve at a peak position obtained by θ-2θ measurements based on X-ray diffraction analysis. In a magnetic head, this value can be sensed as a dispersion angle of a nano-diffraction spot in a cross section.

(v) The connection layer provides such a spring function as couples the upper and lower metallic magnetic layers sandwiching the connection layer therebetween such that the magnetization directions of the metallic magnetic layers are inclined to each other. Such a function cannot be provided if the connection layer is a purely nonmagnetic layer. The connection layer needs to be magnetic and is preferably an antiferromagnetic material in which the spin magnetizations in respective atomic layers are antiparallel aligned, or a material with ferrimagnetism (spinel oxide or the like).

Specific materials for the connection layer and their appropriate thicknesses are shown below.

(v1) Magnetic Oxides
(v1a) Antiferromagnetic Materials
Oxides containing $\alpha$-$Fe_2O_3$ [0.5 to 5 nm];
oxides containing NiO [0.5 to 5 nm]; and
oxides containing $Co_3O_4$ [0.5 to 5 nm].
(v1b) Spinel Oxides (with Antiferromagnetic Spin Alignment)
Oxides containing $MFe_2O_4$ (where M is Fe, Co, Ni, Cu, Mn, Cr, Ti, V or Zn) [0.5 to 5 nm]; and
oxides containing $\gamma$-$Fe_3O_4$ [0.5 to 5 nm].
(v2) Metal Materials having Antiferromagnetic Spin Alignment
Metals at least one element selected from the group consisting of Ti, Cr, Mn, and V;
alloys containing 10 atomic % or more of an element selected from the group consisting of Mn, Cr, V and Ti [0.5 to 5 nm]; and
a layer containing at lease one alloy selected from the group consisting of IrMn, PrMn, PdPtMn, CrMn, NiMn, RuRhMn and RuMn [0.5 to 5 nm].
(v3) Oxides and Nitrides of 3d Transition Metal
Oxides and nitrides based on at least one element selected from the group consisting of Mn, Cr, Ti and V [0.5 to 5 nm].

In any case, an additional element such as Fe, Co, Ni, Cu, Cr, Ti, V, Mn, Zr, Nb, Mo, Hf, Ta, W, Al, or Si may be added to the above materials.

In the case where the connection layer is formed of an oxide layer or nitride layer, the thickness of the oxide layer or nitride layer is preferably not so thick so as to avoid increase in element resistance. Specifically, the thickness of the oxide layer or nitride layer may preferably be set to a range of 0.5 to 3 nm.

Some of the materials listed for the connection layer may generally be regarded as a nonmagnetic material. When such a material is used in the spring spin-valve structure according to the embodiments of the present invention, however, the particular material exhibits magnetism because the material in a form of a thin film is sandwiched between upper and lower metal magnetic layers. The materials listed for the connection layer are those exhibiting magnetism when used in the spring spin-valve structure according to the embodiments of the present invention.

A larger thickness of the connection layer consisting of any of the above materials increases the relative angle between the magnetization directions in the upper and lower metallic magnetic layers. H. Fukazawa et al., J. Appl. Phys. 91, 6684 (2002) discloses a phenomenon that an angle is formed between the magnetization directions in an upper and lower metallic magnetic layers sandwiching a magnetic oxide layer therebetween, although the concept thereof is different from that of the present invention. This document reports that, when the thickness of the magnetic oxide layer is increased by increasing dose amount of oxygen, the angle between the magnetization directions in the upper and lower metallic magnetic layers varies from 0° to 30°, 60°, and 90°, respectively.

The embodiment of the present invention uses at least three metallic magnetic layers to provide the spin-valve function. Consequently, when no media field is applied, the angle between the magnetization directions in an upper and lower metallic magnetic layers sandwiching a single connection layer (which may be called a magnetization alignment angle hereinafter) is within the range of $0<\theta<90°$. Where there are two connection layers, the magnetization alignment angle may be $90°/2=45°$ with respect to one connection layer according to simplified estimation. However, the two connection layers need not necessarily have the same value of the magnetization alignment angle. The preferred magnetization alignment angle per connection layer is 30 to 60°. The magnetization alignment angle within the above range can easily provide the function of the stacked spring spin-valve film.

The connection layer can be formed as described below.

To form a connection layer made of a metallic antiferromagnetic material, it is possible to use a method that the metallic antiferromagnetic material is deposited by sputtering, MBE (Molecular Beam Epitaxy), CVD (Chemical Vapor Deposition), evaporation or PLD (Pulse Laser Deposition).

To form a connection layer made of a magnetic oxide, it is possible to use a method that a metal material is deposited by sputtering, MBE, CVD or evaporation, and then the metal material is oxidized into an oxide. Examples of the oxidizing method include natural oxidation, radical oxidation, ion-beam oxidation and RF plasma oxidation. UV irradiation or substrate heating may be carried out in order to enhance oxidation activity in the oxidation treatment. When the ion beam oxidation is carried out, oxygen gas may be introduced into an ion source or directly into an oxidation chamber. The acceleration energy for the ion beam is preferably set to a range from 50 to 100V. It is also possible to use a method in which an oxide target is used to carry out RF sputtering or ion-beam deposition.

(vi) The cap layer is formed of either of the materials listed below.

Cu [0 to 10 nm]/Ta [1 to 5 nm]; and
Cu [0 to 10 nm]/Ru [0 to 10 nm].

(vii) The upper electrode is formed of Cu, Au, Cu, Ta or NiFe like the lower electrode.

When the magnetoresistive element according to the embodiment of the present invention is applied to a magnetic head, the width W of the spring spin-valve film 16 is processed so as to correspond to a track width. The width W is set to 0.1 μm or less, and to 50 nm or less for a higher recording density. Also, the depth h of the spring spin-valve film 16 is processed so as to be almost equal to the width W. In order to bias the magnetization direction of the free layer so as to be orthogonal to that of the pinned layer, it is possible to provide, for example, a hard layer on the sides of the spring spin-valve film 16. Alternatively, an in-stack bias layer may be provided on the spring spin-valve film 16. However, the embodiment of the present invention does not always require a bias layer.

Since the magnetic coupling between the pinned and the free layer is very weakly in the conventional spin-valve film, a bias-field application film forming an abutted junction is essential for directing the magnetization of the free layer in one direction. However, in the spring spin-valve film according to the present invention, since the pinned layer (metallic magnetic layer closest to the magnetization pinned layer) and the free layer (metallic magnetic layer farthest from the magnetization pinned layer) are magnetically coupled through the connection layer, the magnetization direction of the free layer is determined by the magnetization of the pinned layer. Therefore, use of a proper connection layer may make it possible to set the magnetization alignment angle between the pinned layer and free layers to 90° without any bias-field application film. Exclusion of the bias-field application film brings a great advantage that the structure of a read head for high-density recording can be simplified. The read head for high-density recording has a small track width of 80 nm or less, which makes it difficult to form the abutted junction using a lift-off process. Further, a magnetic field from the bias field application film lowers the read sensitivity of the head, leading to reduction in the head output to some degree. However, since the present invention enables to exclude the bias field application film and to solve the problem of the reduced output attributed to the bias-field application film, it is possible to provide a high head output under a good biased state free from Bulkhausen noise. This structure is suitable for a high-density read head.

When the magnetoresistive element according to the embodiment of the present invention is applied to a magnetic memory (MRAM), an element size larger than that for a magnetic head can be adopted. The spring spin-valve film 16 may be processed to have a width W and a depth h of 1 μm or less. No bias layer is generally provided, and the spring spin-valve film 16 is properly shaped to have uniaxial anisotropy so as to enable switching operations.

The magnetoresistive element according to the embodiment of the present invention can provide a high MR ratio of 20 to 1,000% and a small AR of 60 to 1,000 m $\Omega\mu m^2$.

With reference to FIGS. 3A, 3B and 3C, there will be described the magnetization directions of the metallic magnetic layers for a stacked spring spin-valve film comprising five metallic magnetic layers 1a to 1e and four connection layers 2a to 2d. FIG. 3A shows the case where no external field (media field) is applied, FIG. 3B shows the case where a media field (+) is applied, and FIG. 3C shows the case where a media field (−) is applied.

The stacked spring spin-valve film shown in FIGS. 3A, 3B and 3C is based on exactly the same principle as that described with reference to FIGS. 2A, 2B and 2C. However, under the condition at zero media field, the magnetization directions would be twisted by 90° within the five metallic magnetic layers 1a to 1e from the pinned layer to the free layer. Thus, the angle between the magnetization directions of the two metallic magnetic layers sandwiching each connection layer becomes $90°/4=22.5°$ on the average. However, the magnetization alignment angle for each connection layer need not be the same. Thus, again, the preferred range of the magnetization alignment angle is about 30 to 60°.

If two metallic magnetic layers of different compositions are directly stacked, exchange coupling between the two metallic magnetic layers is so strong that the layers can be considered to be an integrated metallic magnetic layer without dispersion of the magnetization alignment angle. This is applicable to any of FIGS. 2A, 2B, 2C, 3A, 3B and 3C. In other words, each metallic magnetic layer in FIGS. 2A, 2B, 2C, 3A, 3B and 3C may be formed of a stacked film of metallic magnetic layers.

Now, a specific example of a magnetoresistive element structured as shown in FIG. 1 will be described. The film configuration of the magnetoresistive element is as follows:

Lower electrode (11): Cu;
Buffer layer (12): Ta [5 nm]/NiFeCr [5 nm];
Pinning layer (13, 14, 15): PtMn [15 nm]/CoFe [3 nm]/Ru [1 nm];
Metallic magnetic layer (1a): CoFe [2 nm];
Connection layer (2a): $Fe_{80}Co_{20}$ oxide [1.5 nm];
Metallic magnetic layer (1b): CoFe [2 nm];
Connection layer (2b): $Fe_{80}Co_{20}$ oxide [1.5 nm];
Metallic magnetic layer (1c): CoFe [1 nm]/MiFe [3 nm];
Cap layer (17): Cu [1 nm]/Ru [5 nm]; and
Upper electrode (18): Cu.

The magnetoresistive element can be manufactured as described below. Cu constituting the lower electrode 11 is deposited and patterned on a substrate. The substrate is loaded into a DC magnetron sputtering apparatus having an oxidation chamber connected to a sputtering chamber via a vacuum valve. Ta/NiFeCr, PtMn/CoFe/Ru, and CoFe are deposited in order to form the buffer layer 12, pinning layers 13, 14, 15, and a metallic magnetic layer 1a. IrMn may be used as the antiferromagnetic layer instead of PtMn. IrMn may be used as a film with a thickness of about 10 nm, smaller than that of PtMn used at about 15 nm, which is advantageous in device operations and in realization of high-density recording.

The connection layer 2a is formed as follows: $Fe_{80}Co_{20}$ is deposited to a thickness of 1 nm on the metallic magnetic layer 1a. The substrate is then transferred to the oxidation chamber, where it is subjected to ion-beam oxidation, RF plasma oxidation, or radical oxidation. With the oxidation treatment, FeCo is oxidized into a FeCo oxide having a spinel crystal structure. The connection layer preferably has a thickness $t_c$ of 0.5 to 5 nm, more preferably 1 to 2 nm. If the thickness of the connection layer is within the range, the magnetization alignment angle for each connection layer can be set to a range from 30 to 60°.

The substrate is transferred again to a sputtering chamber and CoFe is deposited to form the metallic magnetic layer 1b. FeCo to be formed into the connection layer 2b is subsequently deposited, and then the substrate is transferred to the oxidation chamber and oxidized as described above. The substrate is transferred again to a sputtering chamber, and then CoFe/NiFe and Cu/Ru are deposited to form the metallic magnetic layer 1c and the cap layer 17.

The substrate on which the films have been deposited is subjected to heat treatment in a magnetic field of about 10 kOe at 290° C. for four hours. The spring spin-valve film is subsequently processed by photolithography so that the width thereof is almost equal to the track width. Specifically, the spring spin-valve film is patterned so that the size of each side is made to be 100 to 20 nm. Such a spring spin-valve film can provide an area-resistance product AR of about 60 to 300° m $\Omega\mu m^2$ and a high MR ratio of 20% or more.

In the description of the above example, the FeCo-based oxide is used for the connection layer. However, a metallic antiferromagnetic material such as $Ir_{22}Mn_{78}$ with a thickness about 2 nm may be used for the connection layer. The use of the metal antiferromagnetic layer for the connection layer has an advantage that it can prevent increase in the resistance of the resulting CPP element, compared to the case of the use of the FeCo-based oxide. At high recording density, it is important to reduce the element resistance as small as possible in order to increase high-frequency response. Specifically, the area-resistance product AR needs to be reduced to about 40 to 300 m $\Omega\mu m^2$. The use of the metallic antiferromagnetic material for the connection layer can easily achieve the area-resistance product AR of about 40 to 200 m $\Omega\mu m^2$. This is desirable in terms of high-frequency response. The use of IrMn for the connection layer can provide an area-resistance product AR of about 60 $\Omega\mu m^2$ and a high MR ratio of about 20%.

As shown in FIGS. 2A-2C, and 3A-3C, at least two connection layers are required to bring about weak magnetic coupling for all metallic magnetic layers in the spring spin-valve film according to the embodiments of the present invention. This is because a single connection layer may excessively enhance the effect of magnetic coupling. In other words, gradual magnetization twisting as shown in FIGS. 2A-2C and 3A-3C can be achieved by increasing the number of connection layers or nonmagnetic layers, each of which establishes weaker magnetic coupling between two metallic magnetic layers sandwiching one connection layer than that in a metallic magnetic layer. This enables the operation as the spring spin-valve film.

Now, applications of the magnetoresistive elements according to embodiments of the present invention will be described.

Figure 4:
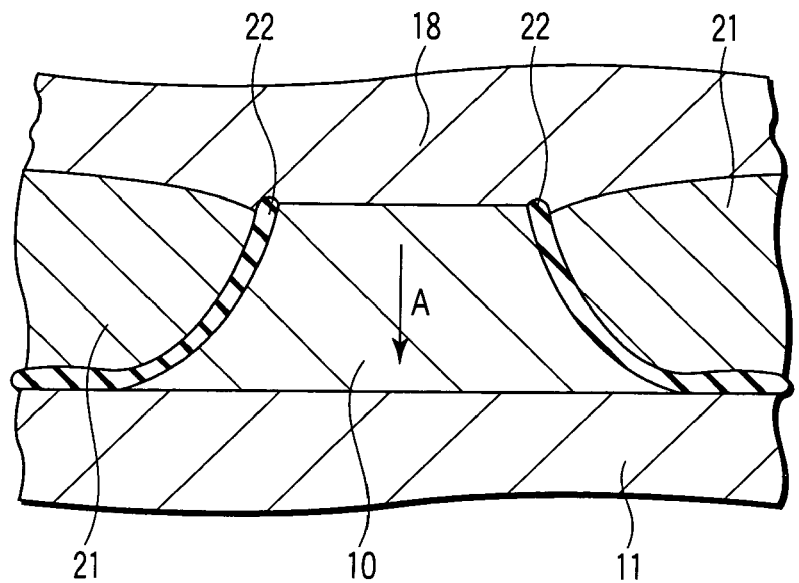
FIG. 4 is a cross-sectional view of a magnetic head according to an embodiment of the present invention.
Figure 5:
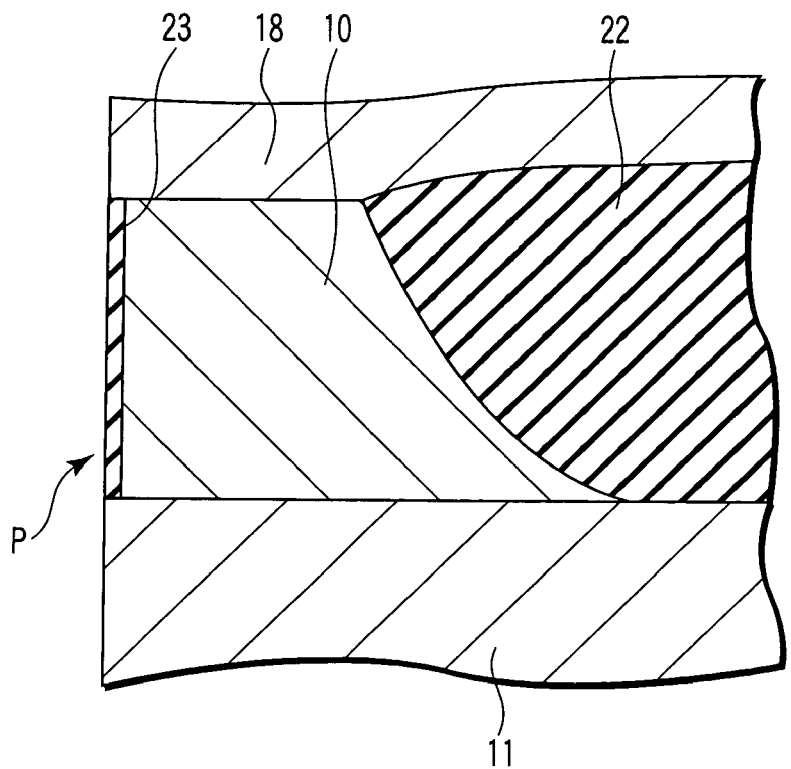
FIG. 5 is a cross-sectional view of a magnetic head according to an embodiment of the present invention.

FIGS. 4 and 5 show the magnetoresistive element according to an embodiment of the present invention which is incorporated in a magnetic head. FIG. 4 is a cross-sectional view of the magnetoresistive element taken along a direction substantially parallel to the air-bearing surface facing a magnetic recording media (not shown). FIG. 5 is a cross-sectional view of the magnetoresistive element taken along a direction perpendicular to the air-bearing surface P.

The magnetic head shown in FIGS. 4 and 5 have a so-called hard abutted structure. The magnetoresistive element 10 has, for example, the structure shown in FIG. 1. The lower electrode 11 and the upper electrode 18 are provided under and over the magnetoresistive element 10, respectively. In FIG. 4, bias field application films 21 and insulating films 22 are stacked on the both sides of the magnetoresistive element 10. As shown in FIG. 5, a protective layer 23 is provided on the air-bearing surface of the magnetoresistive element 10.

A sense current for the magnetoresistive element 10 is supplied by the electrodes 11 and 18 perpendicularly to the plane as shown by arrow A, the electrodes 11 and 18 being arranged under and over the magnetoresistive element 10. Further, the pair of bias field application films 21, 21, provided on the both sides of the magnetoresistive element 10, applies a bias field to the magnetoresistive element 10. The bias field controls the magnetic anisotropy of the free layer in the magnetoresistive element 10 to make the free layer into a single domain. This stabilizes the domain structure of the free layer. It is thus possible to suppress Barkhausen noise associated with movement of magnetic domain walls. It should be noted that, as described previously, the bias magnetic application films may be omitted from the spring spin-valve film depending on the materials of the metallic magnetic layers and connection layers.

The present invention improves the MR ratio of the magnetoresistive element. Accordingly, the application of the present invention to a magnetic head enables sensitive magnetic reproduction.

The magnetic head shown in FIGS. 4 and 5 may be incorporated in a read/write magnetic head assembly, which can then be mounted in a magnetic recording apparatus.

Figure 6:
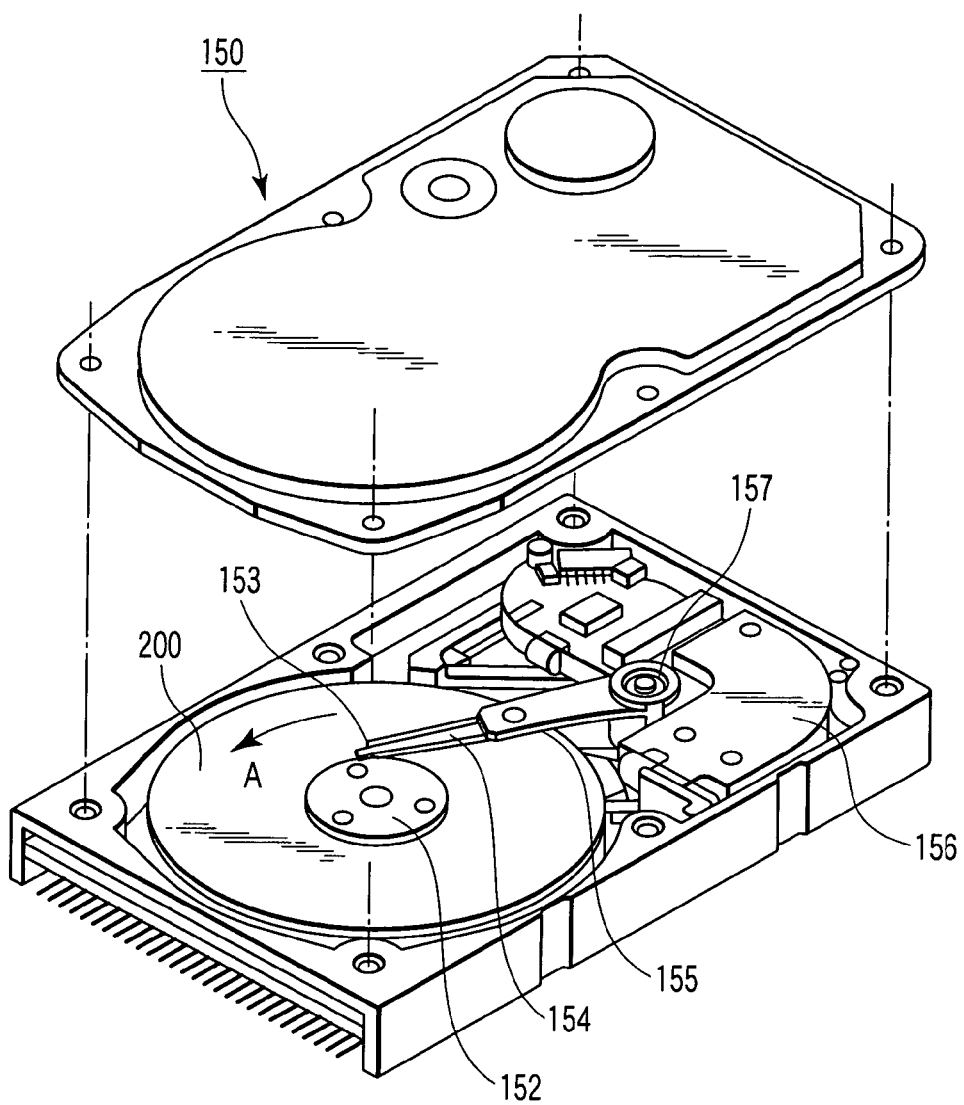
FIG. 6 is a perspective view of a magnetic recording and reproducing apparatus according to an embodiment of the present invention.

FIG. 6 is a perspective view schematically showing the configuration of the major portion of such a magnetic recording/reproducing apparatus. A magnetic recording apparatus 150 is of a type using a rotary actuator. In this figure, a magnetic disk 200 is installed on a spindle 152. The magnetic disk 200 is rotated in the direction of arrow A by the spindle motor that responds to control signals from a drive controller (not shown). The magnetic recording apparatus 150 according to the present invention may comprise a plurality of disks 200.

A head slider 153 is attached to the tip of a suspension 154 to read from and write to the magnetic disk 200. The head slider 153 has a magnetic head mounted near the tip thereof and including the magnetoresistive element according to any of the above embodiments.

When the magnetic disk 200 is rotated, the air-bearing surface (ABS) of the head slider 153 is kept floating above the surface of the magnetic disk 200 at a predetermined height. The head slider 153 may be of a so-called in-contact type contacting with the magnetic disk 200.

The suspension 154 is connected to one end of an actuator arm 155. A voice coil motor 156, a type of a linear motor, is provided on the other end of the actuator arm 155. The voice coil motor 156 is composed of a driving coil (not shown) wound around a bobbin on the other end of the actuator arm 155 and a magnetic circuit comprising a permanent magnet and a counter yoke arranged opposite each other so as to sandwich the coil therebetween.

The actuator arm 155 is supported by ball bearings (not shown) provided at two vertical positions of the pivot 157. The actuator arm 155 can be pivotally rotated by the voice coil motor 156.

Figure 7:
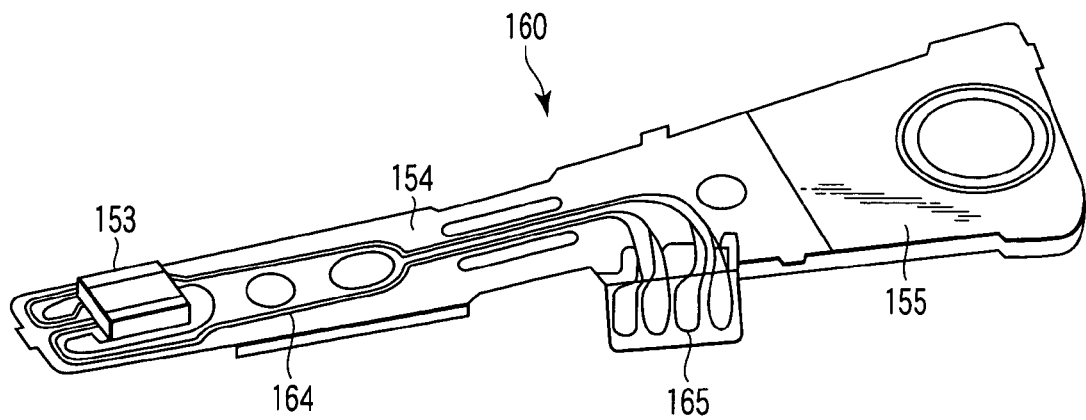
FIG. 7 is a perspective view of a magnetic head assembly according to an embodiment of the present invention.

FIG. 7 is a magnified perspective view of a part of the magnetic head assembly including tip end side of the actuator arm 155, which is viewed from the disk. The magnetic head assembly 160 includes the actuator arm 155 having the bobbin section that holds the driving coil. The suspension 154 is connected to one end of the actuator arm 155.

The head slider 153 is attached to the tip of the suspension 154, and the head slider 153 comprises a magnetic head including the magnetoresistive element according to any of the above embodiments. The suspension 154 has leads 164 for write and read signals. The leads 164 are electrically connected to respective electrodes in the magnetic head incorporated in the head slider 153. Reference numeral 165 in the figure denotes electrode pads of the magnetic head assembly 160.

The present invention comprises the magnetic head including the magnetoresistive element according to any of the above embodiments of the present invention. This makes it possible to reliably read information magnetically recorded on the magnetic disk 200 at a recording density higher than that in the prior art.

Now, a magnetic memory using the magnetoresistive element according to an embodiment of the present invention will be described. That is, the magnetoresistive element according to any of the above embodiments of the present invention makes it possible to provide a magnetic memory, for example, a magnetic random access memory (MRAM) in which memory cells are arrayed in a matrix.

FIG. 8 is a diagram showing an example of the matrix configuration of a magnetic memory according to an embodiment of the present invention. This figure shows the circuit configuration in which memory cells are arrayed. The magnetic memory comprises a column decoder 350 and a row decoder 351 to select one bit in the array. A bit line 334 and a word line 332 are used to turn on and uniquely select a switching transistor 330. Detection by a sense amplifier 352 enables reading of the bit data recorded in the magnetic recording layer (free layer) in the magnetoresistive element 10. To write bit data, a current is passed through a particular word line 323 and a particular bit line 322 to generate a magnetic field to be applied.

FIG. 9 is a diagram showing another example of the matrix configuration of a magnetic memory according to an embodiment of the present invention. In this case, among bit lines 322 and the word lines 334 arrayed in a matrix, one of bit lines 322 is selected by a decoder 361, while one of the word lines 334 is selected by a decoder 360, and thus a particular memory cell in the array is selected. Each memory cell has a structure in which the magnetoresistive element 10 and a diode D are connected in series. Here, the diode D serves to prevent a sense current from bypassing in the memory cells except the selected magnetoresistive element 10. Write operation is performed by using a magnetic field generated by passing a write current through each of a particular bit line 322 and a particular word line 323.

Figure 10:
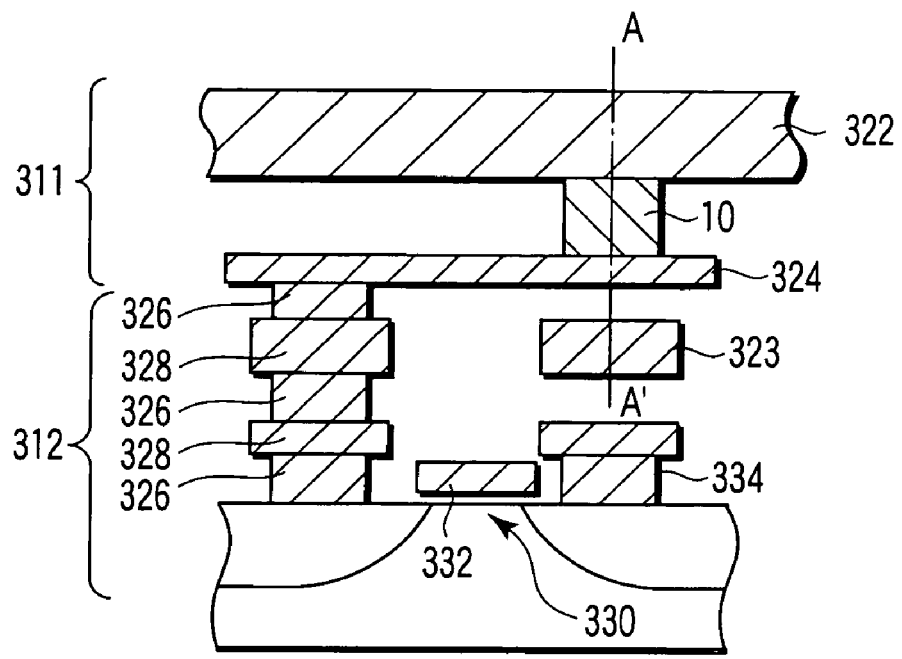
FIG. 10 is a cross-sectional view showing a major portion of a magnetic memory according to an embodiment of the present invention.
Figure 11:
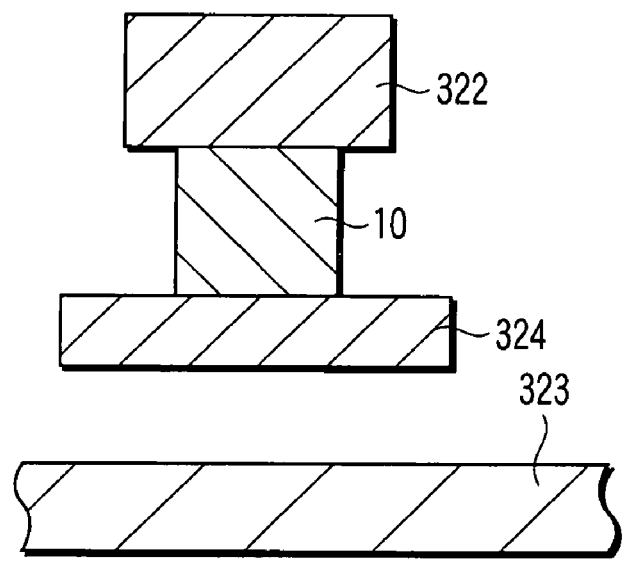
FIG. 11 is a cross-sectional view of the magnetic memory taken along the line A-A' in FIG. 10.

FIG. 10 is a cross-sectional view showing the major portion of a magnetic memory according to an embodiment of the present invention. FIG. 11 is a cross-sectional view taken along the line A-A' in FIG. 18. The structure shown in these figures corresponds to a memory cell for one bit included in the magnetic memory shown in FIG. 8 or 9. The memory cell has a storage element 311 and an address selecting transistor 312.

The storage element 311 has the magnetoresistive element 10 and a pair of wires 322 and 324 connected to the magnetoresistive element 10. The magnetoresistive element 10 is any of the above embodiments.

On the other hand, the selecting transistor 312 is provided with a transistor 330 connected to the magnetoresistive element 10 through vias 326 and buried wires 328. The transistor 330 performs a switching operation in accordance with a voltage applied to a gate 332 to controllably turn on and off the current path between the magnetoresistive element 10 and a wire 334.

A write wire 323 is provided below the magnetoresistive element 10 in a direction orthogonal to the wire 322. The write wires 322 and 323 can be formed of, for example, aluminum (Al), copper (Cu), tungsten (W), tantalum (Ta), or an alloy of these elements.

In the memory configured as described above, to write bit data to the magnetoresistive element 10, a write pulse current is passed through the wires 322 and 323 to induce a synthetic field. The synthetic field is applied to appropriately reverse the magnetization of the recording layer of the magnetoresistive element.

Further, to read bit data, a sense current is passed through the wire 322, the magnetoresistive element 10 including the magnetic recording layer, and the lower electrode 324. Then, the resistance value or a resistance change of the magnetoresistive element 10 is measured.

The magnetic memory according to the embodiment of the present invention uses the magnetoresistive element according to any of the above embodiments. Consequently, even with a reduction in cell size, the magnetic domains in the recording layer are surely controlled to allow write and read operations to be reliably performed.

The embodiments of the present invention have been described with reference to the specific examples. However, the present invention is not limited to these specific examples. For example, for the specific structure of the magnetoresistive element as well as the shapes and materials of the electrodes, bias application film, insulating film, and the like, those skilled in the art can similarly implement the present invention to produce similar effects by making appropriate selections from the well-known arts.

For example, when the magnetoresistive element is applied to a read magnetic head, the detection resolution of the magnetic head can be defined by providing magnetic shields on both sides of the element.

Further, the present invention can be applied to a magnetic head or magnetic recording apparatus based on a perpendicular magnetic recording system as well as a longitudinal magnetic recording system, and can produce similar effects in any system.

Moreover, the magnetic recording apparatus according to the present invention may be a so-called a rigid type constantly provided with particular recording media or a so-called "removable" type that allows recording media to be exchangeable.

The scope of the present invention also includes all the magnetoresistive elements, magnetic heads, magnetic recording/reproducing apparatuses, and magnetic memories that can be implemented by those skilled in the art by appropriately changing the designs of the above magnetic heads and magnetic recording/reproducing apparatuses described above as the embodiments of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
   at least three metallic magnetic layers;
   connection layers each provided between the metallic magnetic layers; and
   electrodes which supply a current perpendicularly to a plane of a stack of the metallic magnetic layers and the connection layers,
   wherein a magnetization direction of a lowermost or uppermost metallic magnetic layer of the metallic magnetic layers is pinned, and a magnetization alignment angle per connection layer is 30 to 60° at zero external field.

2. A magnetic memory comprising the magnetoresistive element according to claim 1.

3. The magnetoresistive element according to claim 1, wherein the connection layer is formed of an oxide or nitride containing at least one element selected from the group consisting of Co, Fe, Ni, Mn, Ti, V and Cr, and having a thickness of 0.5 nm or more and 5.0 nm or less.

4. The magnetoresistive element according to claim 3, wherein the connection layer is formed of $\alpha$-Fe2O3, or $\gamma$-Fe2O3 or XFe2O4, where X is Fe, Co, Ni, Mn or Cr, with a spinel crystal structure or an inverse spinel crystal structure.

5. The magnetoresistive element according to claim 1, wherein the connection layer is formed of a metallic antiferromagnetic material having a thickness of 0.5 nm or more and 5 nm or less.

6. The magnetoresistive element according to claim 5, wherein the connection layer is formed of a metallic antiferromagnetic material selected from the group consisting of Mn and XMn, where X is Ni, Ir, Pt, Pd, Cr, Ru or Rh.

7. The magnetoresistive element according to claim 1, wherein the connection layer is formed a metal layer containing at least one element selected from the group consisting of Ti, Cr, Mn and V.

8. The magnetoresistive element according to claim 7, wherein the metal layer has a thickness of 0.5 nm or more and 5 nm or less.

9. The magnetoresistive element according to claim 1, wherein the metallic magnetic layer is formed of a material containing at least one element selected from the group consisting of Co, Fe, and Ni, and having a thickness of 0.5 nm or more and 5.0 nm or less.

10. A magnetic head comprising the magnetoresistive element according to claim 1.

11. A magnetic recording/reproducing apparatus comprising:
    a magnetic recording media; and
    the magnetic head according to claim 10.

* * * * *